(12) United States Patent
Guter

(10) Patent No.: US 9,911,885 B2
(45) Date of Patent: Mar. 6, 2018

(54) SOLAR CELL STACK

(71) Applicant: AZUR SPACE Solar Power GmbH, Heilbronn (DE)

(72) Inventor: Wolfgang Guter, Stuttgart (DE)

(73) Assignee: Azur Space Solar Power GmbH, Heilbronn (DE)

( * ) Notice: Subject to any disclaimer, the term of this patent is extended or adjusted under 35 U.S.C. 154(b) by 388 days.

(21) Appl. No.: 14/513,799

(22) Filed: Oct. 14, 2014

(65) Prior Publication Data

US 2015/0034142 A1 Feb. 5, 2015

Related U.S. Application Data

(63) Continuation of application No. PCT/EP2013/001074, filed on Apr. 12, 2013.

(30) Foreign Application Priority Data

Apr. 12, 2012 (EP) .................................... 12002602

(51) Int. Cl.
*H01L 31/0687* (2012.01)
*H01L 31/18* (2006.01)
*H01L 31/032* (2006.01)

(52) U.S. Cl.
CPC ........ *H01L 31/0687* (2013.01); *H01L 31/032* (2013.01); *H01L 31/1844* (2013.01);
(Continued)

(58) Field of Classification Search
CPC .................................................. H01L 31/0687
See application file for complete search history.

(56) References Cited

U.S. PATENT DOCUMENTS

| 2009/0145476 A1* | 6/2009 | Fetzer ................... H01L 31/184 136/256 |
| 2010/0116327 A1* | 5/2010 | Cornfeld ........... H01L 31/06875 136/255 |
| 2015/0053257 A1 | 2/2015 | Dimroth et al. |

FOREIGN PATENT DOCUMENTS

WO    WO 2013/132073 A2    9/2013

OTHER PUBLICATIONS

King, et al., "Band-Gap-Engineered Architectures for High-Efficiency Multijunction Concentrator Solar Cells", Presented at the 24th European Photovoltaic Solar Energy Conference and Exhibition, Hamburg, Germany, Sep. 21-25, 2009.*

(Continued)

*Primary Examiner* — Tae-Sik Kang
(74) *Attorney, Agent, or Firm* — Muncy, Geissler, Olds & Lowe, P.C.

(57) ABSTRACT

A solar cell stack having multiple semiconductor solar cells, each semiconductor solar cell having a first solar subcell with a top and a bottom and a first semiconductor solar cell, and wherein the first semiconductor solar cell has a first lattice constant, and the solar cell stack has a second solar subcell with a top and a bottom and a second semiconductor solar cell, and wherein the second semiconductor solar cell has a second lattice constant, and wherein the first solar subcell is arranged in a frictional manner with its bottom on the top of the second solar subcell, and wherein an abrupt difference is formed between the first lattice constant and the second lattice constant and the difference between the first lattice constant and the second lattice constant is at least 0.5% or an amorphous layer is formed.

16 Claims, 3 Drawing Sheets

(52) U.S. Cl.
CPC ...... *H01L 31/1852* (2013.01); *H01L 31/1892* (2013.01); *Y02E 10/544* (2013.01); *Y02P 70/521* (2015.11)

(56) References Cited

OTHER PUBLICATIONS

King et al., "Band-Gap Engineered Architectures for High-Efficiency Multifunction Concentrator Solar Cells," 24$^{th}$ Eur. Photovoltaic Sol. Eng. Conf., pp. 55-61 (Sep. 21, 2009).

Dimroth et al., "3-6 Junction Photovoltaic Cells for Space and Terrestrial Concentrator Applications," Record of the 31$^{st}$ IEEE Photovolt. Spec. Conf., pp. 525-529 (Jan. 3, 2005).

Wiemer et al., "43.5% Efficient Lattice Matched Solar Cells," Proc. SPIE (High and Low Conc. Sys. for Solar Elec. Apps. VI), vol. 8108, pp. 1-5 (Aug. 22, 2011).

Yu et al., "Nanobonding for Multi-Junction Solar Cells at Room Temperature," ECS Trans., vol. 35, No. 2, pp. 3-10 (Jan. 2, 2011).

Tanabe et al., "III-V/Si hybid photonic devices by direct fusion bonding," Sci. Rep., vol. 2, pp. 1-6 (Apr. 2, 2012).

\* cited by examiner

SOLAR CELL STACK

This nonprovisional application is a continuation of International Application No. PCT/EP2013/001074, which was filed on Apr. 12, 2013, and which claims priority to European Patent Application No. 12002602.6, which was filed in Europe on Apr. 12, 2012, and which are both herein incorporated by reference.

BACKGROUND OF THE INVENTION

Field of the Invention

The invention relates to a solar cell stack.

Description of the Background Art

A solar cell stack having multiple solar cells is known from US Publication 2006/0021565. In a first embodiment therein, a thin heteroepitaxial semiconductor seed layer is applied to an active Si substrate, and then the additional III/V solar cells are epitaxially grown on the seed layer. In another embodiment, a III/V multi-junction solar cell that has already been grown, consisting of a stack of multiple III/V semiconductor solar cells, is bonded as the first solar subcell to a silicon solar cell with an n+ doped surface, which is to say joined, in order to form a covalent, low resistance connection. The first solar subcell here has a tunnel diode with two differently doped layers of GaAs at the surface that is to be bonded. Both the silicon surface and the surface of the III/V solar subcell are made extremely planar. A difficulty in the joining consists in great bowing of the bonded layers as a result of the different crystal lattices and different coefficients of thermal expansion. An attempt is made to reduce the bowing of the solar cell stack by means of a special backside coating.

A III/V multi-junction solar cell with a metamorphic intermediate layer is known from "Current-matched Triple Junction Solar Cell Reaching 41.1% Conversion Efficiency Under Concentrated Sunlight", by Wolfgang Guter et al., in *Applied Physics Letters* 94, 223504 (2009). Such metamorphic intermediate layers act as an intermediary between the different lattice constants of stacked semiconductor solar cells. The different lattice constants of the semiconductor layers are a result of the choice of the semiconductor materials based on different band gaps in order to increase the efficiency of the solar cell stack, wherein the metamorphic intermediate layers permit crystalline growth of a second semiconductor solar cell on a first semiconductor solar cell with a different lattice constant. It is a disadvantage of the metamorphic intermediate layers that, even though the surface of the second semiconductor solar cell is crystalline in structure, because of misfit dislocations and other crystal defects, it has a large number of mesa-like elevations and generally an increased roughness, and hence the surface of the second semiconductor solar cell does not appear suitable for wafer bonding. Moreover, after epitaxy, the solar cells are more strongly bowed as a result of the strain on the lattice-mismatched layers, which likewise precludes wafer bonding. For this reason, exclusively epitaxial process steps are used for producing multi-junction solar cells such as, in particular, a triple junction cell. This makes it possible to avoid a resource-intensive semiconductor bonding process.

Furthermore, additional III/V multi-junction solar cells are known from "Development of Advanced Space Solar Cells at Spectrolab," by J. Boisvert et al, in *Photovoltaic Specialists Conference (PVSC)*, 2010 *35th IEEE*, 20-25 Jun. 2010, Honolulu, ISSN: 0160-8371. In one embodiment, solar cell stacks of more than three individual semiconductor solar cells are produced by semiconductor bonding (SBT) of a first solar subcell to a second solar subcell. In order to obtain a sufficiently planar surface, low surface roughness, and low bowing for bonding, the first solar subcell and the second solar subcell are epitaxially grown on the relevant substrates in a lattice-matched fashion, which is to say without metamorphic intermediate layers. In this process, one of the solar subcells is grown on the very costly InP substrate. In production, such expensive substrates are generally separated either before joining or after joining and re-used.

Additional manufacturing processes and embodiments for a III/V triple junction solar cell stack are known from "Metamorphic GaAsP buffers for Growth of Wide-bandgap InGaP Solar Cells", by J. Simon et al, in *Journal of Applied Physics* 109, 013708-1 to 013708-5, (2011).

In addition, a joining of a first solar cell stack to a second solar cell stack is known from US 2010/011 6327 A1, wherein one of the two solar cell stacks has a metamorphic intermediate layer. Each of the two solar cell stacks has a bonding layer made of InGaAs.

SUMMARY OF THE INVENTION

It is therefore an object of the invention to provide a device that advances the state of the art.

According to an embodiment of the subject matter of the invention, a solar cell stack is provided having multiple semiconductor solar cells made of Ge and/or a Ge compound and a III/V compound, wherein each semiconductor solar cell contains a p-n junction, and the solar cell stack has a first solar subcell with a top and a bottom and a first semiconductor solar cell, and wherein the first semiconductor solar cell has a first lattice constant, and the solar cell stack has a second solar subcell with a top and a bottom and a second semiconductor solar cell, and wherein the second semiconductor solar cell has a second lattice constant and the difference between the first lattice constant and the second lattice constant is at least 0.5%, and wherein the first solar subcell is arranged in a frictional manner with its bottom on the top of the second solar subcell, and at least one of the two solar subcells includes an additional semiconductor solar cell and a metamorphic intermediate layer, and the lattice constant of the metamorphic intermediate layer changes by at least 0.5% along the thickness dimension of the metamorphic intermediate layer, and wherein a boundary with an abrupt difference of at least 0.5% between the first lattice constant and the second lattice constant is formed between the bottom of the first solar subcell and the top of the second solar subcell.

In other words, an abrupt difference is created between the bottom of the first solar subcell and the top of the second solar subcell due to the differences between the first lattice constant and the second lattice constant, wherein the difference between the first lattice constant and the second lattice constant is at least 0.5% or an amorphous layer is formed, and wherein the first solar subcell and/or the second solar subcell includes an additional semiconductor solar cell in addition to the first semiconductor solar cell or the second semiconductor solar cell, and wherein the first solar subcell and/or the second solar subcell includes a metamorphic intermediate layer, and wherein the metamorphic intermediate layer comprises a first layer thickness and the lattice constant of the metamorphic intermediate layer changes by at least 0.5% along the thickness dimension of the layer.

It should be noted that an operative electrical connection can be formed between the individual solar cells, which is to say that the solar cell stack can be electrically connected at the top and at the bottom. When light is incident on the top of the solar cell stack, an electrical voltage is established as a result of the conversion of light. The voltage can be picked off by means of the electrical contacts. In addition, it should be noted that in the present document the term "amorphous" is used in accordance with general technical knowledge, and it refers to a layer that has an irregular pattern as in glass and only has a short-range order, but no long-range order. It should likewise be noted that in the present document the term "in a frictional manner" is only used in accordance with general technical knowledge, and is understood to mean a connection between the first solar cell stack and the second solar cell stack, wherein the connection requires a normal force on the surfaces to be connected to one another, so that mutual shifting of the two surfaces to be connected is prevented in this way. It is also understood that a metamorphic buffer has a plurality of chemically different, stacked, thin layers.

It is an advantage that a solar cell stack can be joined, which is to say bonded, economically and reliably, despite the formation of a metamorphic layer in the first solar subcell and/or in the second solar subcell. It is precisely in the combination of metamorphic layers and the joining that, according to investigations, in the case of the III/V compounds and in conjunction with a germanium layer and/or a layer made of a germanium compound the applicable lattice constant can be chosen in an extremely advantageous fashion such that very different band gaps are formed and a high total efficiency of the solar cell stack is achieved without it being necessary for yet another resource-intensive metamorphic intermediate layer or multiple intermediate layers to be formed at the boundary, which is to say between the first solar subcell and the second solar subcell. In particular, this method avoids first increasing the lattice constant in a first metamorphic intermediate layer and then decreasing it in a second, later, metamorphic intermediate layer, or vice versa. Investigations have shown that changing the lattice constants in different directions sharply decreases the crystal quality.

It became apparent that a solar cell stack can be created easily and reliably, despite the considerable surface roughness because of the already inserted metamorphic intermediate layer, and despite the lattice difference, which is necessary to further increase the efficiency through different, mutually coordinated band gaps.

In addition, it is advantageous that two solar subcells can be separately and independently produced on different substrates with high crystal quality, and can subsequently be joined in a stack with at least one triple junction cell, with no need for the two solar subcells to be epitaxially grown such that they are lattice-matched to one another. Furthermore, as compared to non-bonded solar cell stacks, a very resource-intensive epitaxial process is eliminated that only produces low yields, in which the lattice constant changes in different directions, and that requires multiple epitaxy steps that are each coordinated one with the other.

The substrates can be removed equally well either before or after joining, and preferably can be reused for manufacturing additional solar subcells. Especially reliable and economical stacked multi-junction solar cells can be produced to good advantage and with high yields by this means, especially in the area of III/V solar cells. Furthermore, it is also possible to use significantly more economical substrates, such as Ge, or a compound of Ge or GaAs, for example. Investigations have shown that the very costly InP substrate, in particular, can now be replaced by a germanium substrate and that the variation in the band gaps can nonetheless be matched optimally to the solar wavelength spectrum. In contrast to the use of a combination of Si carrier layers with III/V semiconductor compounds, a thermal mismatch between the solar subcells is avoided when GaAs and/or Ge carrier layers are used. Ge has a coefficient of thermal expansion that is comparable to that of the III/V semiconductor compounds.

In an embodiment, the boundary comprises an amorphous layer, wherein the layer has a thickness of less than 20 nm. According to another embodiment, the bottom of the first solar subcell comprises a first chemical compound, and the top of the second solar subcell comprises a second chemical compound, and the first compound differs from the second compound in at least one chemical element.

In an embodiment, a metamorphous intermediate layer is formed between the first semiconductor solar cell or the second semiconductor solar cell and the additional semiconductor solar cell of a solar subcell. In this way, two directly consecutive solar cells can be formed with different lattice constants.

In another embodiment, the first semiconductor solar cell and/or the second semiconductor solar cell is located directly at the boundary that is formed by the joining of the first solar subcell to the second solar subcell. Accordingly, the amorphous layer and the abrupt change in the lattice constants are formed between the first semiconductor solar cell and the second semiconductor solar cell. In addition, it should be noted that the first solar subcell preferably is electrically connected to the second solar subcell at the boundary by means of a tunnel diode.

In an embodiment, the solar cells in one of the two solar subcells can have exclusively lattice-matched layers. It is preferred for the first solar subcell and/or the second solar subcell to be implemented as multi-junction solar cells. It is advantageous if the first solar subcell and the second solar subcell are integrally joined to one another, in particular with the formation of a crystalline or amorphous semiconductor boundary layer, preferably by wafer bonding, extremely preferably by semiconductor bonding. In another further development, the two solar subcells are connected by a conductive adhesive.

In an embodiment, the first solar subcell can be mechanically connected to the second solar subcell by means of a fastening device, in particular a clamping device.

Investigations have shown that it is advantageous if the first solar subcell or the second solar subcell contains a triple junction or quadruple junction solar cell. In one embodiment of this design, the first solar subcell and/or the second solar subcell have multiple metamorphic intermediate layers. According to an alternative embodiment, the first solar subcell and/or the second solar subcell have a support layer. According to an alternative embodiment, the first solar subcell and/or the second solar subcell have no support layer.

In an embodiment, the second solar subcell comprises a semiconductor solar cell made of germanium and a semiconductor solar cell made of a GaInAs or Al—InGaAs compound, and the first solar subcell comprises a semiconductor solar cell made of a GaAs, AlGaAs, InGaAs, or AlInGaAs compound and a semiconductor solar cell made of an InGaP or AlInGaP compound. In another further development, the second solar subcell comprises a semiconductor solar cell made of germanium and a semiconductor solar cell made of a GaInAs or AlGaInAs compound, and the first solar subcell comprises a semiconductor solar cell made of a GaAs or InGaAs compound and a semiconductor solar cell made of an AlGaAs or AlInGaAs compound and a semiconductor solar cell made of an AlInGaP compound.

The first solar subcell and the second solar subcell can comprise four semiconductor solar cells with a first band gap in the range from 1.8 eV to 2.0 eV and with a second band gap in the range from 1.3 eV to 1.5 eV and with a third band gap in the range from 0.9 to 1.1 eV and with a fourth band gap in the range from 0.6 to 0.7 eV.

In an embodiment, the first solar subcell and the second solar subcell together can comprise five semiconductor solar cells with a first band gap in a range from 1.9 eV to 2.1 eV and with a second band gap in a range from 1.6 to 1.8 eV and with a third band gap in a range from 1.4 to 1.6 eV and with a fourth band gap in a range from 0.9 to 1.1 eV and with a fifth band gap in a range from 0.6 to 0.7 eV.

In an embodiment, the first solar subcell and the second solar subcell together can comprise six semiconductor solar cells with a first band gap in a range from 1.9 eV to 2.1 eV and with a second band gap in a range from 1.6 to 1.9 eV and with a third band gap in a range from 1.4 to 1.6 eV and with a fourth band gap in a range from 1.0 to 1.5 eV and with a fifth band gap in a range from 0.8 to 1.1 eV and with a sixth band gap in a range from 0.6 to 0.7 eV.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
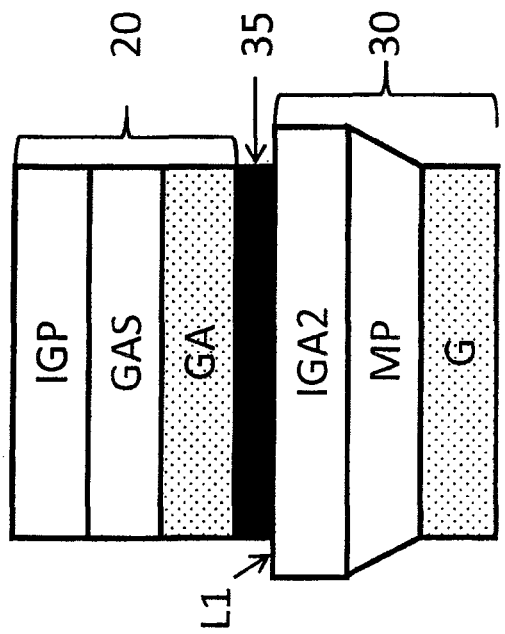
FIG. 1 shows a schematic cross-section of an embodiment of a solar cell module.

The illustration in FIG. 1 shows a schematic cross-section of an embodiment according to the invention of a solar cell module 10 with a first solar subcell 20 and a second solar subcell 30. The first solar subcell 20 has a top and a bottom. As the first layer in the first solar subcell 20, a GaAs layer GA is formed, preferably as a carrier layer. Arranged on the layer GA is a first semiconductor solar cell in the form of a GaAs solar cell GAS, preferably with a band gap in a range between 1.3 and 1.5 eV. The first semiconductor solar cell has a first lattice constant. Arranged on the first boundary semiconductor solar cell is an additional semiconductor solar cell in the form of an InGaP solar cell IGP, preferably with a band gap in a range between 1.8 and 2.0 eV.

The second solar subcell 30 has a top and a bottom. Formed in the second solar subcell 30 is an additional semiconductor solar cell in the form of a Ge solar cell G, preferably with a band gap in a range between 0.6 and 0.7 eV. Alternatively, a first layer made of Ge or a Ge compound can be formed instead of or in addition to the additional solar cell. The first layer is preferably implemented as a carrier layer. Formed on the Ge solar cell G is a metamorphic intermediate layer MP with a first layer thickness. The lattice constant of the metamorphic intermediate layer MP changes along the thickness dimension of the metamorphic intermediate layer by at least 0.5%, with the layer of the metamorphic intermediate layer MP adjacent to the additional semiconductor solar cell having the smaller lattice constant. Arranged on the metamorphic intermediate layer MP is a second semiconductor solar cell in the form of an InGaAs solar cell IGA2, preferably with a band gap in a range between 0.9 eV and 1.1 eV. The second semiconductor solar cell has a second lattice constant.

The first solar subcell 20 is arranged in a frictional manner, and in particular integrally, with its bottom on the top of the second solar subcell 30 at a boundary 35 so that a vertical stack of four solar cells with four different band gaps is formed. An abrupt difference between the first lattice constant and the second lattice constant is formed at the boundary 35 between the bottom of the first solar subcell 20 and the top of the second solar subcell 30. The first lattice constant is smaller than the second lattice constant here, with the difference between the first lattice constant and the second lattice constant being at least 0.5%. The difference between the first lattice constant and the second lattice constant is illustrated by a lateral difference in width L1 between the first solar subcell 20 and the second solar subcell 30.

According to an alternative that is not shown, a thin amorphous layer is formed at the boundary at the bottom of the first solar subcell 20 and/or at the top of the second solar subcell 30. Preferably the layer thickness of the amorphous layer is in the range below 20 nm, and extremely preferably below 8 nm.

Figure 2:
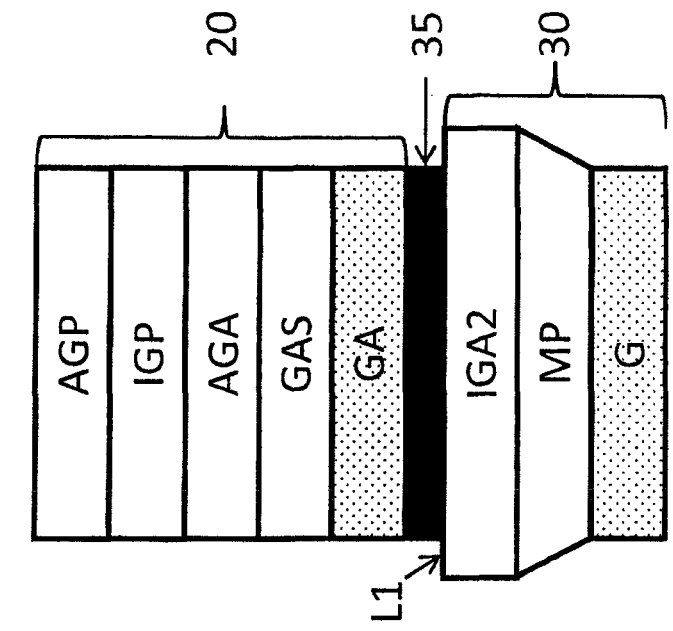
FIG. 2 shows a schematic cross-section of an embodiment of a solar cell module.

The illustration in FIG. 2 shows a schematic cross-section of an embodiment according to the invention of a solar cell module 10. Only the differences from the embodiment in FIG. 1 are explained below. The first solar subcell 20 additionally comprises, as an additional semiconductor solar cell, an AlGaAs solar cell AGA, preferably with a band gap in a region between 1.4 and 1.6 eV. Arranged to rest on the additional semiconductor solar cell is another semiconductor solar cell in the form of an InGaP solar cell IGP, preferably with a band gap in a region between 1.6 eV and 1.9 eV. Resting thereupon is yet another additional semiconductor solar cell in the form of an AlInGaP solar cell AGP, preferably with a band gap in a region between 1.9 eV and 2.1 eV. In all, the first solar subcell comprises four solar cells, and the entire solar cell stack comprises 6 solar cells. The second solar subcell corresponds in structure to the one in FIG. 1.

Figure 3:
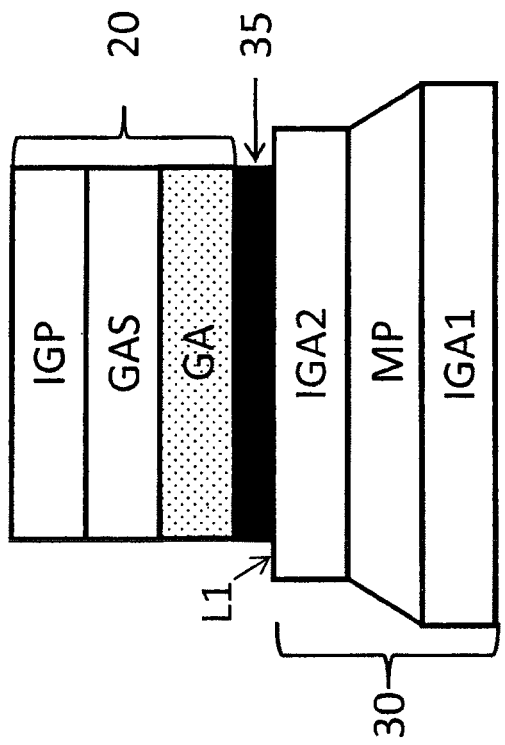
FIG. 3 shows a schematic cross-section of an embodiment of a solar cell module.

The illustration in FIG. 3 shows a schematic cross-section of an embodiment according to the invention of a solar cell module 10. Only the differences from the embodiments in the preceding figures are explained below. The first solar subcell 20 corresponds in structure to the one in FIG. 1. In contrast thereto, in the second solar subcell 30 the second semiconductor solar cell is implemented in the form of an InGaAs solar cell IGA2, preferably with a band gap in a region between 0.9 eV and 1.2 eV. The second layer located below the metamorphic intermediate layer MP is implemented in the form of the GaAs layer GA, preferably as a carrier layer.

Figure 4:
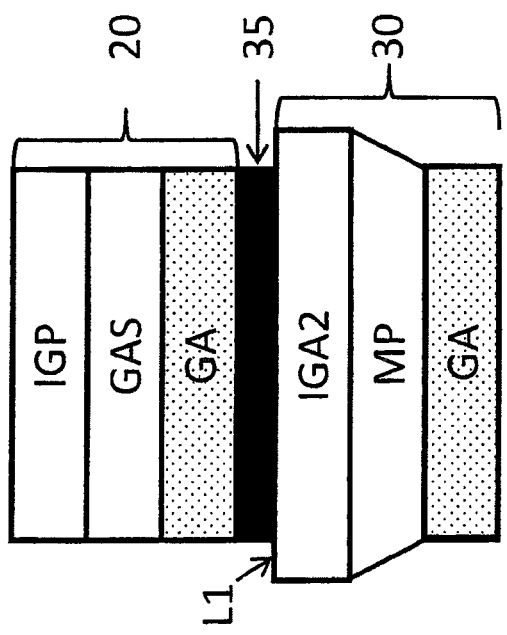
FIG. 4 shows a schematic cross-section of an embodiment of a solar cell module.

The illustration in FIG. 4 shows a schematic cross-section of an embodiment according to the invention of a solar cell module 10. Only the differences from the embodiments in the preceding figures are explained below. The first solar subcell 20 corresponds in structure to the first solar subcell 20 in FIG. 1.

In contrast thereto, in the second solar subcell 30 the additional semiconductor solar cell is implemented in the form of an InGaAs solar cell IGA1, preferably with a band gap in a region between 0.5 and 0.7 eV. The metamorphic intermediate layer MP with the first layer thickness is formed on the InGaAs solar cell IGA1. Once again, the lattice constant of the metamorphic intermediate layer MP changes by at least 0.5% along the thickness dimension, with the layer of the metamorphic intermediate layer MP adjacent to the second semiconductor solar cell having the smallest lattice constant within the metamorphic intermediate layer MP. The second semiconductor solar cell in the form of an InGaAs solar cell IGA2, preferably with a band gap in a range between 0.9 eV and 1.2 eV, is located on the metamorphic intermediate layer MP.

In an alternative embodiment, another metamorphic intermediate layer with the second layer thickness is formed above the second semiconductor solar cell, with the layer of the additional metamorphic intermediate layer adjacent to the second semiconductor solar cell having the largest lattice constant within the additional metamorphic intermediate layer. In addition, in another alternative embodiment that is not shown, the second layer located above the additional metamorphic intermediate layer is implemented in the form of the GaAs layer, preferably as a carrier layer, and stands in integral contact with the bottom of the first solar subcell 20. In all, the solar cell stack 10 in the fourth embodiment comprises four solar cells. If the GaAs carrier layer is removed prior to joining, the additional metamorphic intermediate layer can be removed along with it, and the result is the embodiment according to the invention shown in FIG. 4.

Figure 5:
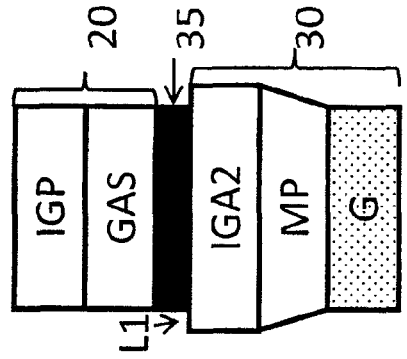
FIGS. 5a-5e show a schematic cross-section of an embodiment of a solar cell module.
Figure 5:
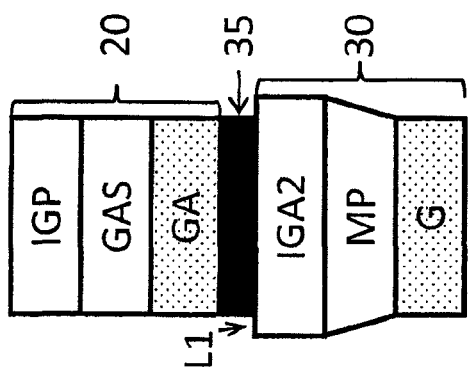
Figure 5:
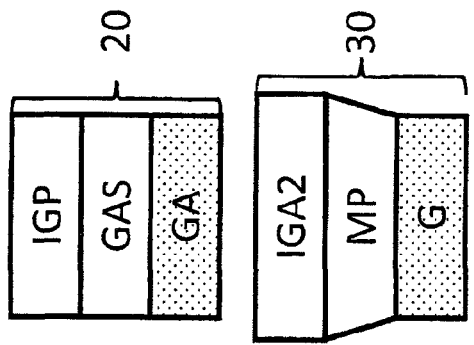
Figure 5:
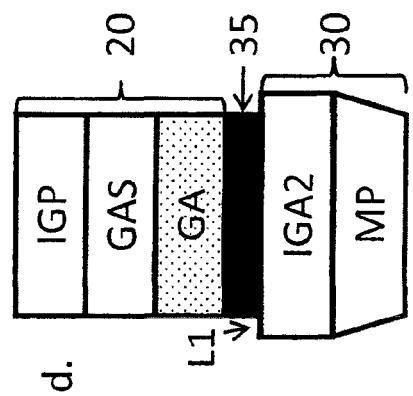
Figure 5:
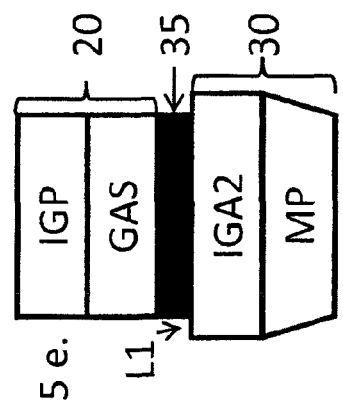

The illustration in FIG. 5a-5e shows a schematic cross-section of an embodiment according to the invention of a solar cell module 10 in an unbonded state as shown in FIG. 5a, and the resultant possible bonded variations as shown in FIG. 5b-5e. Only the differences from the embodiments in the preceding figures are explained below. In FIG. 5a, the first solar subcell 20 corresponds in structure to the first solar subcell 20 in FIG. 1, and the second solar subcell 30 corresponds in structure to the second solar subcell 30 from FIG. 1, which is to say that the result after bonding is in each case a solar cell stack with three or four solar cells depending on the degree to which the layer made of Ge or a Ge compound is implemented as a carrier layer and/or as a solar cell.

In the first variation shown in FIG. 5b, the first solar subcell 20 and the second solar subcell 30 are shown joined by means of a bonding process, wherein the applicable layer structure of the first solar subcell 20 and of the second solar subcell 30 are unchanged, and as a result, the first variation corresponds directly to the embodiment from FIG. 1, but is mentioned again for reasons of clarity.

In the second variation shown in FIG. 5c, the first solar subcell 20 and the second solar subcell 30 are again shown joined by means of a bonding process, wherein only the layer structure of the first solar subcell 20 is changed. The first carrier layer implemented as a GaAs layer GA was removed prior to joining of the first solar subcell 20 to the second solar subcell 30.

In the third variation shown in FIG. 5d, the first solar subcell 20 and the second solar subcell 30 are again shown joined by means of a bonding process, wherein only the layer structure of the second solar subcell 30 is changed. Here, the first layer made of Ge or a Ge compound, preferably implemented as a carrier layer, was removed either prior to or after bonding. In the present case, a triple junction solar cell was produced by this means. If the Ge layer G is only partially removed so that its p-n junction is preserved, then a thinner quadruple junction solar cell is produced.

In the fourth variation shown in FIG. 5e, the first solar subcell 20 and the second solar subcell 30 are again shown joined by means of a bonding process, wherein the layer structure of the first solar subcell 20 and the layer structure of the second solar subcell 30 are changed. In this regard, this is a combination of the third and fourth variations. In the first solar subcell 20, the additional layer in the form of the GaAs carrier layer, implemented as a support layer, was removed prior to bonding, and in the second solar subcell 30, the first layer made of Ge or a Ge compound, preferably implemented as a carrier layer, was also removed either prior to or after bonding. In the present case, a triple junction solar cell was likewise produced by this means. If the Ge layer G is only partially removed so that its p-n junction is preserved, then a thin quadruple junction solar cell is produced.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A solar cell stack comprising:
at least three semiconductor solar cells made of Ge and/or a Ge compound and/or a III/V semiconductor compound, wherein each of the at least three semiconductor solar cells contains a p-n junction and comprises:
a first solar subcell with a top and a bottom and a first semiconductor solar cell, the first semiconductor solar cell having a first lattice constant, and
a second solar subcell with a top and a bottom and a second semiconductor solar cell, the second semiconductor solar cell having a second lattice constant,
wherein a difference between the first lattice constant and the second lattice constant is at least 0.5%,
wherein the first solar subcell is arranged in a frictional manner with the bottom of the first solar subcell on the top of the second solar subcell,
wherein at least one of the first solar subcell and the second solar subcell includes an additional semiconductor solar cell and a metamorphic intermediate layer, and
wherein the metamorphic intermediate layer comprises a first layer thickness and the lattice constant of the metamorphic intermediate layer changes by at least 0.5% along a thickness dimension of the metamorphic intermediate layer; and,
a boundary with an abrupt difference of at least 0.5% between the first lattice constant and the second lattice constant is formed between the bottom of the first solar subcell and the top of the second solar subcell, the boundary having a predetermined thickness, wherein the boundary comprises an amorphous layer being present and having a layer thickness below 20 nm.

2. The solar cell stack according to claim 1, wherein the bottom of the first solar subcell comprises a first chemical compound, and the top of the second solar subcell comprises a second chemical compound, and wherein the first compound differs from the second compound in at least one chemical element.

3. The solar cell stack according to claim 1, wherein the first solar subcell or the second solar subcell comprises exclusively lattice-matched layers.

4. The solar cell stack according to claim 1, wherein the first solar subcell and the second solar subcell are integrally joined to one another.

5. The solar cell stack according to claim 1, wherein the first solar subcell and the second solar subcell are connected to one another by semiconductor bonding.

6. The solar cell stack according to claim 1, wherein the first solar subcell and the second solar subcell are connected to one another by wafer bonding.

7. The solar cell stack according to claim 1, wherein the first solar subcell is mechanically connected to the second solar subcell by a fastening device or a clamping device.

8. The solar cell stack according to claim 1, wherein the first solar subcell or the second solar subcell contains a triple junction solar cell or a quadruple junction solar cell.

9. The solar cell stack according to claim 1, wherein the first solar subcell and/or the second solar subcell have a plurality of metamorphic intermediate layers.

10. The solar cell stack according to claim 1, wherein the first solar subcell and/or the second solar subcell include a support layer.

11. The solar cell stack according to claim 1, wherein the first solar subcell and/or the second solar subcell have no support layer.

12. The solar cell stack according to claim 1, wherein the second solar subcell comprises a semiconductor solar cell made of germanium and a semiconductor solar cell made of an InGaAs or AlInGaAs compound, and wherein the first solar subcell comprises a semiconductor solar cell made of a GaAs, AlGaAs, InGaAs, or AlInGaAs compound and a semiconductor solar cell made of an InGaP or InAlGaP compound.

13. The solar cell stack according to claim 1, wherein the second solar subcell comprises a semiconductor solar cell made of germanium and a semiconductor solar cell made of an InGaAs or AlInGaAs compound, and wherein the first solar subcell comprises a semiconductor solar cell made of a GaAs or InGaAs compound and a semiconductor solar cell made of an AlGaAs or AlInGaAs compound and a semiconductor solar cell made of an AlInGaP compound.

14. The solar cell stack according to claim 1, wherein the first solar subcell and the second solar subcell comprise four semiconductor solar cells with a first band gap in a range from 1.8 eV to 2.0 eV and a second band gap in a range from 1.3 eV to 1.5 eV and a third band gap in a range from 0.9 to 1.1 eV and a fourth band gap in a range from 0.6 to 0.7 eV.

15. The solar cell stack according to claim 1, wherein the first solar subcell and the second solar subcell comprise five semiconductor solar cells with a first band gap in a range from 1.9 eV to 2.1 eV and a second band gap in a range from 1.6 to 1.8 eV and a third band gap in a range from 1.4 to 1.6 eV and a fourth band gap in a range from 0.9 to 1.1 eV and a fifth band gap in a range from 0.6 to 0.7 eV.

16. The solar cell stack according to claim 1, wherein the first solar subcell and the second solar subcell comprise six semiconductor solar cells with a first band gap in a range from 1.9 to 2.1 eV and a second band gap in a range from 1.6 to 1.9 eV and a third band gap in a range from 1.4 to 1.6 eV and a fourth band gap in a range from 1.0 to 1.5 eV and a fifth band gap in a range from 0.8 to 1.1 eV and a sixth band gap in a range from 0.6 to 0.7 eV.

* * * * *